(12) United States Patent
Han (10) Patent No.: US 11,538,866 B2
(45) Date of Patent: Dec. 27, 2022

(54) OLED DISPLAY PANEL AND DISPLAY DEVICE

(71) Applicant: Shenzhen China Star Optoelectronics Semiconductor Display Technology Co., Ltd., Guangdong (CN)

(72) Inventor: Zhibin Han, Guangdong (CN)

(73) Assignee: Shenzhen China Star Optoelectronics Semiconductor Display Technology Co., Ltd, Guangdong (CN)

( * ) Notice: Subject to any disclaimer, the term of this patent is extended or adjusted under 35 U.S.C. 154(b) by 205 days.

(21) Appl. No.: 16/954,102

(22) PCT Filed: May 21, 2020

(86) PCT No.: PCT/CN2020/091654
§ 371 (c)(1),
(2) Date: Jun. 16, 2020

(87) PCT Pub. No.: WO2021/212587
PCT Pub. Date: Oct. 28, 2021

(65) Prior Publication Data
US 2022/0130916 A1    Apr. 28, 2022

(30) Foreign Application Priority Data
Apr. 23, 2020 (CN) .......................... 202010326087.7

(51) Int. Cl.
*H01L 27/32* (2006.01)

(52) U.S. Cl.
CPC ...... *H01L 27/3218* (2013.01); *H01L 27/3223* (2013.01)

(58) Field of Classification Search
None
See application file for complete search history.

(56) References Cited

U.S. PATENT DOCUMENTS

| | | | |
|---|---|---|---|
| 11,257,870 B2* | 2/2022 | Tu | H01L 51/5016 |
| 2015/0048322 A1* | 2/2015 | So | H01L 27/3246 257/40 |
| 2016/0284769 A1 | 9/2016 | Chien et al. | |
| 2016/0329385 A1* | 11/2016 | Qiu | H01L 27/3218 |
| 2018/0053812 A1* | 2/2018 | Wacyk | H01L 27/3218 |

(Continued)

FOREIGN PATENT DOCUMENTS

| | | |
|---|---|---|
| CN | 104752469 A | 7/2015 |
| CN | 104904015 A | 9/2015 |

(Continued)

*Primary Examiner* — Steven M Christopher
(74) *Attorney, Agent, or Firm* — PV IP PC; Wei Te Chung; Ude Lu (57) ABSTRACT

An organic light-emitting diode (OLED) display panel and a display device are provided. The OLED display panel includes first pixel units and second pixel units that are arranged symmetrically-mirrored to each other. A longitudinal direction of pixel electrode of each pixel unit is parallel to a longitudinal direction of the OLED display panel. Blue sub-pixels of each pixel unit are individually arranged in a row, and red sub-pixels and green sub-pixels are arranged together in another row, so as to alleviate technical problems where a pixel arrangement of traditional hybrid arrangement OLED panels restricts printing method.

18 Claims, 6 Drawing Sheets

(56) References Cited

U.S. PATENT DOCUMENTS

| | | | | |
|---|---|---|---|---|
| 2018/0166510 A1* | 6/2018 | Lee | ................. | H01L 27/3248 |
| 2018/0294324 A1* | 10/2018 | Madigan | ............. | H01L 27/3218 |
| 2019/0181184 A1* | 6/2019 | Hu | ................. | H01L 51/5036 |
| 2019/0206948 A1* | 7/2019 | Ren | ................. | H01L 51/5016 |
| 2020/0279894 A1* | 9/2020 | Madigan | ............. | H01L 51/0005 |
| 2021/0057495 A1* | 2/2021 | Yuan | ............... | H01L 27/3227 |

FOREIGN PATENT DOCUMENTS

| | | |
|---|---|---|
| CN | 205959985 U | 2/2017 |
| CN | 108231827 A | 6/2018 |

\* cited by examiner

OLED DISPLAY PANEL AND DISPLAY DEVICE

FIELD OF INVENTION

The present application relates to the field of display technologies, and in particular to an organic light-emitting diode (OLED) display panel and a display device.

BACKGROUND OF INVENTION

Figure 1:
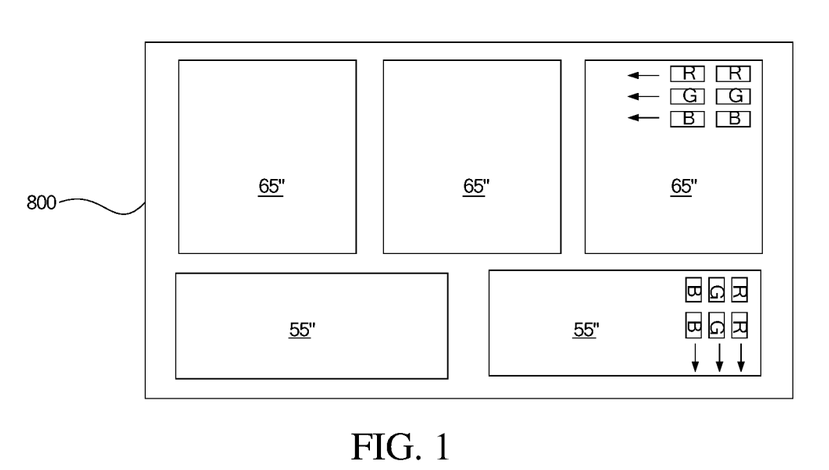
FIG. 1 is a schematic bottom view of an arrangement of display panels on a glass substrate according to a conventional hybrid arrangement technology.
Figure 2:
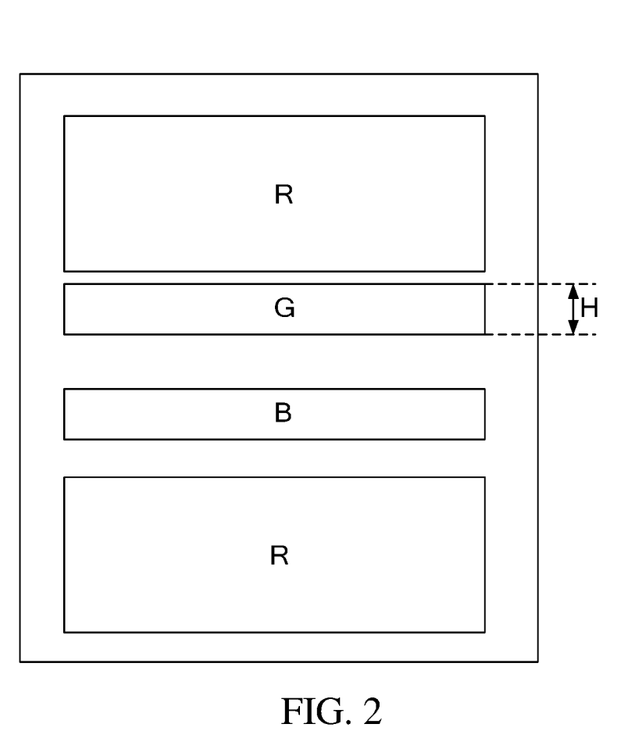
FIG. 2 is a schematic bottom view of a comparison of printing widths of each sub-pixel according to a conventional linear printing.

Organic light-emitting diode (OLED) displays have gradually become high-end displays, replacing liquid crystal displays due to their advantages of ultra-high contrast ratio, wide color gamut, fast response times, and active light emission. As OLED displays and OLED TVs continue to increase in size, the size of their corresponding mass-produced glass substrates increase as well. In order to maximize a glass utilization rate, it is necessary to prepare OLED products of different sizes on a same glass substrate using a hybrid arrangement technique, that is, a multi model group (MMG). A traditional hybrid arrangement of OLED panels and pixel arrangement is shown in FIG. 1. Different sizes of OLED panels in 65" and 55" are arranged perpendicular to each other on a same glass substrate 800. Since the pixel arrangement of the OLED panels is that a longitudinal direction of sub-pixels is parallel to a short side direction of the panels, the longitudinal direction of the sub-pixels red (R)/green (G)/blue (B) is shown as an arrow direction in FIG. 1. As a result, pixel arrangement directions of different sizes of the two OLED panels are perpendicular to each other. A commonly used method for printing OLED luminescent materials is to print an entire strip of a same color sub-pixels in a same bank region, that is, a line-bank printing method. As shown in FIG. 1, the sub-pixels R/G/B are respectively printed as an entire strip. Therefore, the traditional hybrid arrangement of the OLED panels and the pixel arrangement limits the line-bank printing method: after printing the OLED panels of one product, the glass substrate is rotated 90° before printing the OLED panels of the other product. This leads to an increase in equipment cost and an increase in production time, which is detrimental to mass production. In the meantime, in high pixel density (pixels per inch, PPI) panel designs, due to a poor luminous efficiency of the sub-pixels B, a higher aperture ratio is required, which further cuts down an aperture ratio of the sub-pixels G and the sub-pixels R, which cannot even meet a minimum width H requirement for printing, as shown in FIG. 2.

Therefore, a problem of the traditional hybrid arrangement of the OLED panels and the pixel arrangement that restricts the printing method and needs to be solved.

SUMMARY OF INVENTION

The present application provides an organic light-emitting diode (OLED) display panel and a display device, so as to alleviate technical problems that pixel arrangement of conventional hybrid arrangement OLED panels restricts printing method.

To solve the above problems, technical solutions provided by the present application are as follows.

An embodiment of the present application provides an organic light-emitting diode (OLED) display panel, including a plurality of first pixel units and a plurality of second pixel units, the first pixel units and the second pixel units arranged symmetrically-mirrored to each other, wherein each of the first pixel units includes a first sub-pixel including a first pixel electrode, and a longitudinal direction of the first pixel electrode arranged parallel to a longitudinal direction of the OLED display panel. A second sub-pixel includes a second pixel electrode, the second pixel electrode arranged adjacent to the first pixel electrode but in a different row, and a longitudinal direction of the second pixel electrode arranged parallel to the longitudinal direction of the OLED display panel. A third sub-pixel includes a third pixel electrode, the third pixel electrode and the second pixel electrode arranged in a same row and spaced apart from each other, and a longitudinal direction of the third pixel electrode arranged parallel to the longitudinal direction of the OLED display. Wherein, the first pixel electrode is covered with an entire strip of blue electroluminescent material, and the second pixel electrode and the third pixel electrode are covered with a second electroluminescent material.

In the OLED display panel provided by an embodiment of the present application, the second electroluminescent material includes a yellow electroluminescent material.

In the OLED display panel provided by an embodiment of the present application, a width of the second pixel electrode is equal to a width of the third pixel electrode, and the width of the second pixel electrode or the width of the third pixel electrode is less than or equal to a width of the first pixel electrode.

In the OLED display panel provided by an embodiment of the present application, a sum of a length of the second pixel electrode and a length of the third pixel electrode is less than a length of the first pixel electrode.

In the OLED display panel provided by an embodiment of the present application, the length of the second pixel electrode is equal to the length of the third pixel electrode.

In the OLED display panel provided by an embodiment of the present application, each of the first sub-pixel, the second sub-pixel, and the third sub-pixel further includes a thin film transistor and a via-hole defined in the thin film transistor, and the first pixel electrode, the second pixel electrode, and the third pixel electrode are connected to the corresponding thin film transistor through the via-hole, respectively.

In the OLED display panel provided by an embodiment of the present application, each of the first sub-pixel, the second sub-pixel, and the third sub-pixel further includes a bridge electrode, the bridge electrode and the first pixel electrodes are arranged in a same layer, and the bridge electrodes are connected to corresponding the first pixel electrode, the second pixel electrode, and the third pixel electrode, respectively.

In the OLED display panel provided by an embodiment of the present application, each of the bridge electrodes is arranged close to the via-hole of a corresponding pixel electrode.

In the OLED display panel provided by an embodiment of the present application, a length of the bridge electrode is less than an interval between the first pixel units and the second pixel units.

In the OLED display panel provided by an embodiment of the present application, materials of the first pixel electrode, the second pixel electrode, the third pixel electrode, and the bridge electrode include indium tin oxide.

The present application further provides a display device, which includes an organic light-emitting diode (OLED) display panel and a cover plate provided on the OLED display panel, the OLED display panel including a plurality of first pixel units and a plurality of second pixel units, the first pixel units and the second pixel units arranged symmetrically-mirrored to each other, the first pixel unit includes a first sub-pixel, a second sub-pixel, and a third sub-pixel. Wherein, the first sub-pixel includes a first pixel electrode, and a longitudinal direction of the first pixel electrode arranged parallel to a longitudinal direction of the OLED display panel. The second sub-pixel includes a second pixel electrode, the second pixel electrode arranged adjacent to the first pixel electrode but in a different row, and a longitudinal direction of the second pixel electrode arranged parallel to the longitudinal direction of the OLED display panel. The third sub-pixel includes a third pixel electrode, the third pixel electrode and the second pixel electrode arranged in a same row and disposed at intervals, and a longitudinal direction of the third pixel electrode arranged parallel to the longitudinal direction of the OLED display. Wherein, the first pixel electrode is covered with an entire strip of blue electroluminescent material, and the second pixel electrode and the third pixel electrode are covered with a second electroluminescent material. The cover plate is provided with a red filter and a green filter, and the red filter and the green filter are arranged corresponding to the second sub-pixel or the third sub-pixel, respectively.

In the display device provided by an embodiment of the present application, the second electroluminescent material includes a yellow electroluminescent material.

In the display device provided by an embodiment of the present application, a width of the second pixel electrode is equal to a width of the third pixel electrode, and the width of the second pixel electrode or the width of the third pixel electrode is less than or equal to a width of the first pixel electrode.

In the display device provided by an embodiment of the present application, a sum of a length of the second pixel electrode and a length of the third pixel electrode is less than a length of the first pixel electrode.

In the display device provided by an embodiment of the present application, the length of the second pixel electrode is equal to the length of the third pixel electrode.

In the display device provided by an embodiment of the present application, each of the first sub-pixel, the second sub-pixel, and the third sub-pixel further includes a thin film transistor and a via-hole defined in the thin film transistor, and the first pixel electrode, the second pixel electrode, and the third pixel electrode are connected to the corresponding thin film transistor through the via-hole, respectively.

In the display device provided by an embodiment of the present application, each of the first sub-pixel, the second sub-pixel, and the third sub-pixel further includes a bridge electrode, the bridge electrode and the first pixel electrodes are arranged in a same layer, and the bridge electrodes are connected to corresponding the first pixel electrode, the second pixel electrode, and the third pixel electrode, respectively.

In the display device provided by an embodiment of the present application, each of the bridge electrodes is arranged close to the via-hole of a corresponding pixel electrode.

In the display device provided by an embodiment of the present application, a length of the bridge electrode is less than an interval between the first pixel units and the second pixel units.

In the display device provided by an embodiment of the present application, materials of the first pixel electrode, the second pixel electrode, the third pixel electrode, and the bridge electrode include indium tin oxide.

The beneficial effects of the present application are as follows. In the OLED display panel and the display device provided by the present application, a longitudinal direction of a pixel electrode of each sub-pixel is parallel to a longitudinal direction of the OLED display panel, and electroluminescent material is printed on the pixel electrode in a strip. In the case of hybrid arrangement, it is not necessary to rotate glass substrate by 90°, and the OLED panels of the two products can be printed directly. Without increasing equipment and time costs, it is suitable for mass production. In the meantime, the blue sub-pixels are arranged in one row individually, and the red and green sub-pixels are arranged together in another row. In the case where an aperture ratio of the blue sub-pixels is sufficiently large, it is ensured that a printing width of the red and green sub-pixels will not be greatly reduced and the minimum printing width cannot be reached. In addition, each sub-pixel is also provided with a bridge electrode. When a broken line or a broken circuit problem occurs in a control circuit of a certain sub-pixel during manufacturing, the bridge electrode and the adjacent sub-pixel of a same color can be bridged together by laser welding, realizing repairing function.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

Figure 3:
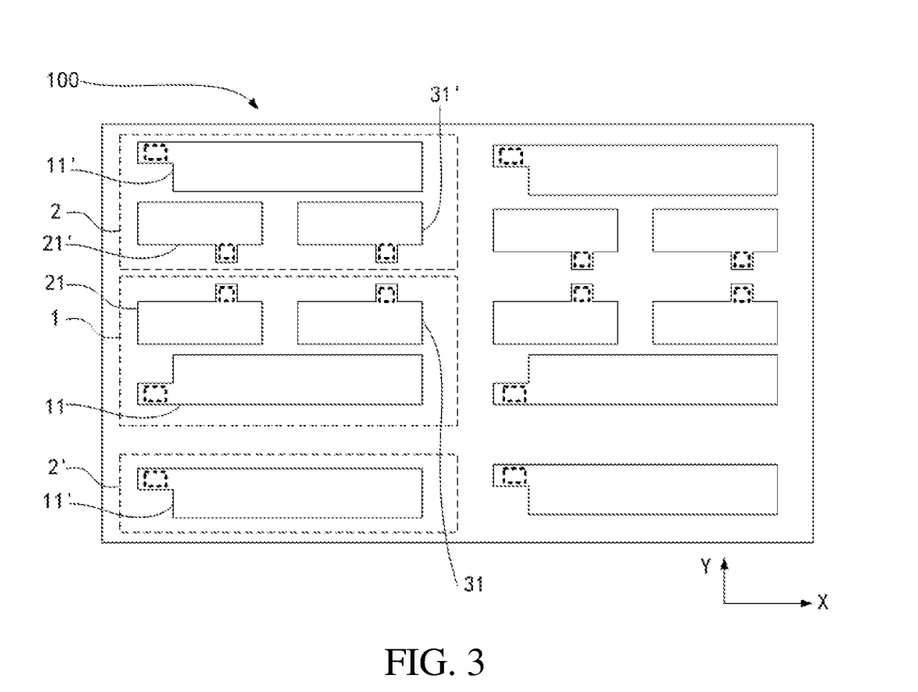
FIG. 3 is a schematic bottom view of a first organic light-emitting diode (OLED) display panel according to an embodiment of the present application.
Figure 4:
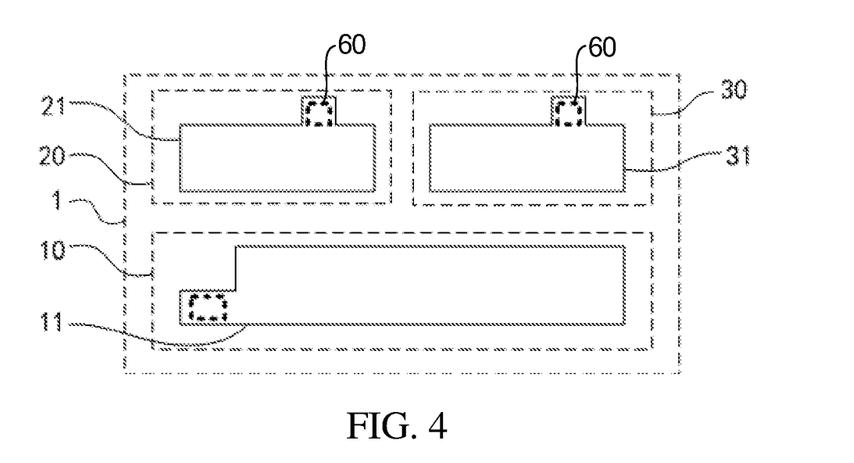
FIG. 4 is a schematic bottom view of a structure of a first pixel unit according to an embodiment of the present application.
Figure 5:
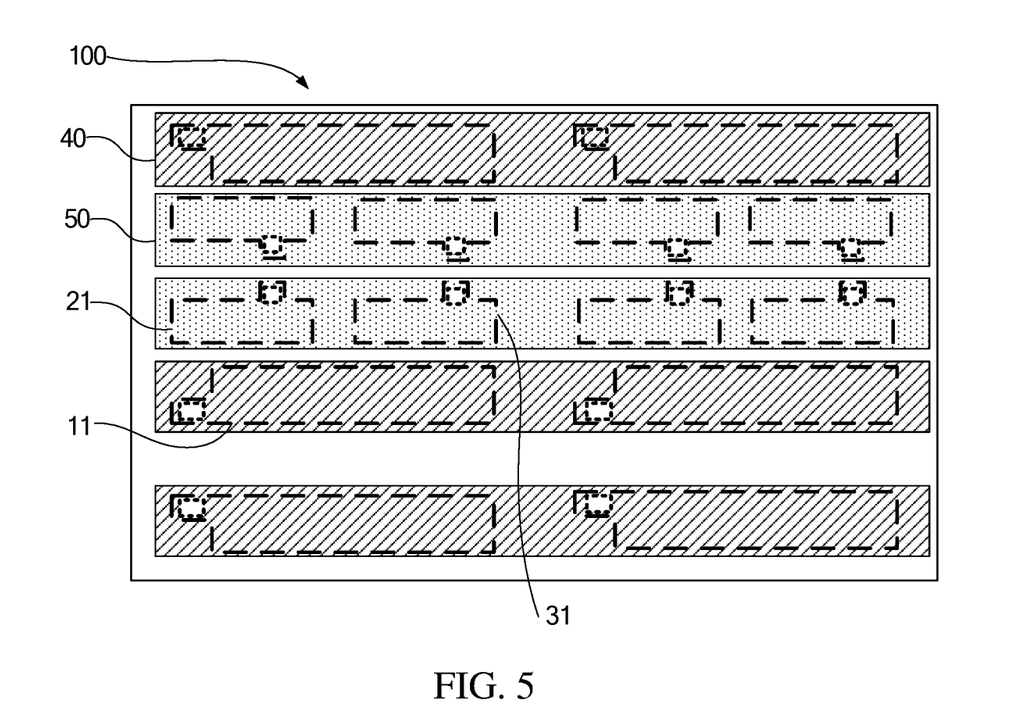
FIG. 5 is a schematic bottom view of an arrangement of electroluminescent materials on an OLED display panel according to an embodiment of the present application.

In an embodiment, an organic light-emitting diode (OLED) display panel 100 is provided, as shown in FIG. 3, which includes a plurality of first pixel units 1 and a plurality of second pixel units 2, each of the first pixel units 1 and each of the second pixel units 2 are symmetrically-mirrored to each other. As shown in FIG. 4, each first pixel unit 1 includes a first sub-pixel 10, a second sub-pixel 20, and a third sub-pixel 30. Refer to FIG. 3 and FIG. 4, the first sub-pixel 10 includes a first pixel electrode 11, a longitudinal direction of the first pixel electrode 11 is parallel to a longitudinal direction X of the OLED display panel 100 (X represents the longitudinal direction of the OLED display panel, and Y represents a short side direction of the OLED display panel in the figure). The second sub-pixel 20 includes a second pixel electrode 21, which is adjacent to the first pixel electrode 11 but in a different row (the row described in the present application refers to a row parallel to the longitudinal direction X of the OLED display panel 100). Moreover, a longitudinal direction of the second pixel electrode 21 is parallel to the longitudinal direction X of the OLED display panel 100. The third sub-pixel 30 includes a third pixel electrode 31, the third pixel electrode 31 and the second pixel electrode 21 are disposed at intervals, and a longitudinal direction of the third pixel electrode 31 is parallel to the longitudinal direction X of the OLED display panel 100. As shown in FIG. 5, the first pixel electrodes 11 are covered with an entire strip of blue electroluminescent material 40, and the second pixel electrode 21 and the third pixel electrode 31 are covered with a second electroluminescent material 50.

Figure 6:
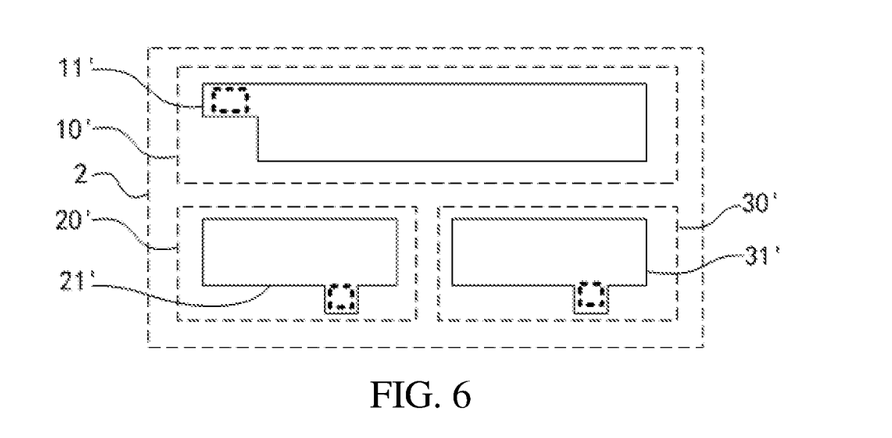
FIG. 6 is a schematic bottom view of a structure of a second pixel unit according to an embodiment of the present application.

Specifically, as shown in FIG. 6, where each of the second pixel units 2 also includes three sub-pixels, namely a first sub-pixel 10', a second sub-pixel 20', and a third sub-pixel 30'. Each sub-pixel also includes a pixel electrode, such as a first pixel electrode 11', a second pixel electrode 21', and a third pixel electrode 31' as shown in FIG. 6.

Specifically, the first pixel units 1 and the second pixel units 2 are arranged alternately at intervals, and are symmetrically-mirrored to each other. That is, the first pixel units 1 are arranged in a row along the longitudinal direction X of the OLED display panel 100, and the second pixel units 2 are arranged in another row along the longitudinal direction X of the OLED display panel 100. Moreover, the first pixel units 1 are positioned between the two rows of second pixel units, such as the second pixel unit 2 and the second pixel unit 2' shown in FIG. 3, wherein the second pixel unit 2' only shows a part.

Specifically, two second pixel units are arranged adjacent to the first pixel unit 1, wherein the first pixel electrode 11' of one of the second pixel units 2' is arranged adjacent to the first pixel electrode 11 of the first pixel unit 1, and the second pixel electrode 21' and the third pixel electrode 31' of the other second pixel unit 2 are arranged adjacent to the second pixel electrode 21 and the third pixel electrode 31 of the first pixel unit 1.

Furthermore, taking the first pixel unit 1 as an example, as shown in FIG. 3, the longitudinal direction of the first pixel electrode 11 is parallel to the longitudinal direction X of the OLED display panel 100, and the plurality of first pixel electrodes 11 are arranged in a row at intervals along the longitudinal direction X of the OLED display panel 100. The longitudinal direction of the second pixel electrode 21 and the third pixel electrode 31 is parallel to the longitudinal direction X of the OLED display panel 100, the second pixel electrodes 21 and the third pixel electrodes 31 are disposed at intervals and staggered in a row, and are arranged in a different row from the first pixel electrodes 11.

Figure 7:
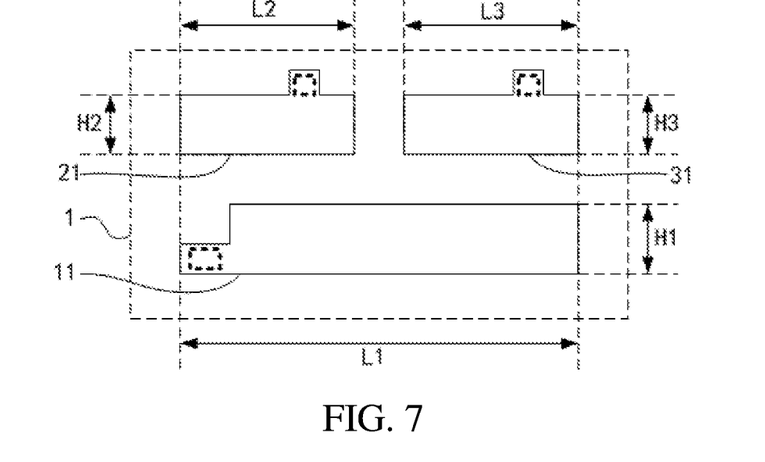
FIG. 7 is a schematic bottom view of a comparison of each of pixel electrode structures of the first pixel unit according to an embodiment of the present application.

Specifically, as shown in FIG. 7, a width H2 of the second pixel electrode 21 is equal to a width H3 of the third pixel electrode 31, and the width H2 of the second pixel electrode 21 or the width H3 of the third pixel electrode 31 is less than or equal to a width H1 of the first pixel electrode 11.

Furthermore, a sum of a length L2 of the second pixel electrode 21 and a length L3 of the third pixel electrode 31 is less than a length L1 of the first pixel electrode 11.

Furthermore, the length L2 of the second pixel electrode 21 is equal to the length L3 of the third pixel electrode 31. Of course, the present application is not limiting the length L2 of the second pixel electrode 21 to be equal to the length L3 of the third pixel electrode 31, as the length L2 of the second pixel electrode 21 and the length L3 of the third pixel electrode 31 may not be equal.

Furthermore, as shown in FIG. 4, each of the first sub-pixel 10, the second sub-pixel 20, and the third sub-pixel 30 further includes a thin film transistor (not shown) and a via-hole 60 defined in the thin film transistor, and the first pixel electrode 11, the second pixel electrode 21, and the third pixel electrode 31 are connected to the corresponding thin film transistor through the via-hole 60, respectively.

Furthermore, the first pixel electrode of the first sub-pixel is covered with an entire strip of blue electroluminescent material. That is, the first sub-pixel is a blue sub-pixel of the first pixel unit.

Furthermore, the second pixel electrode of the second sub-pixel and the third pixel electrode of the third sub-pixel are covered with an entire strip of the second electroluminescent material.

Furthermore, the second electroluminescent material includes yellow electroluminescent material and the like.

Furthermore, the second sub-pixel and the third sub-pixel emit yellow light due to the use of yellow electroluminescent materials, therefore, in order to achieve red and green in the three primary colors, the second sub-pixel and the third sub-pixel need to be matched to use a red filter and a green filter. Of course, the present application is not limited to the use of yellow electroluminescent materials.

It can be understood that an arrangement of the pixel electrodes of the sub-pixels of the second pixel unit and an arrangement of the electroluminescent material are same as the sub-pixels of the first pixel unit, respectively.

In the present embodiment, the longitudinal direction of the pixel electrode of each sub-pixel is parallel to the longitudinal direction of the OLED display panel, and electroluminescent material is printed on the pixel electrode in a strip. In cases of hybrid arrangement, it is not necessary to rotate the glass substrate by 90°, and the OLED panels of two products can be printed directly. Without increasing equipment and time costs, it is suitable for mass production. In the meantime, the blue sub-pixels are arranged in one row individually, and the red and green sub-pixels are arranged together in another row. In the case where an aperture ratio of the blue sub-pixels is sufficiently large, it is ensured that a printing width of the red and green sub-pixels will not be greatly reduced and the minimum printing width cannot be reached.

Figure 8:
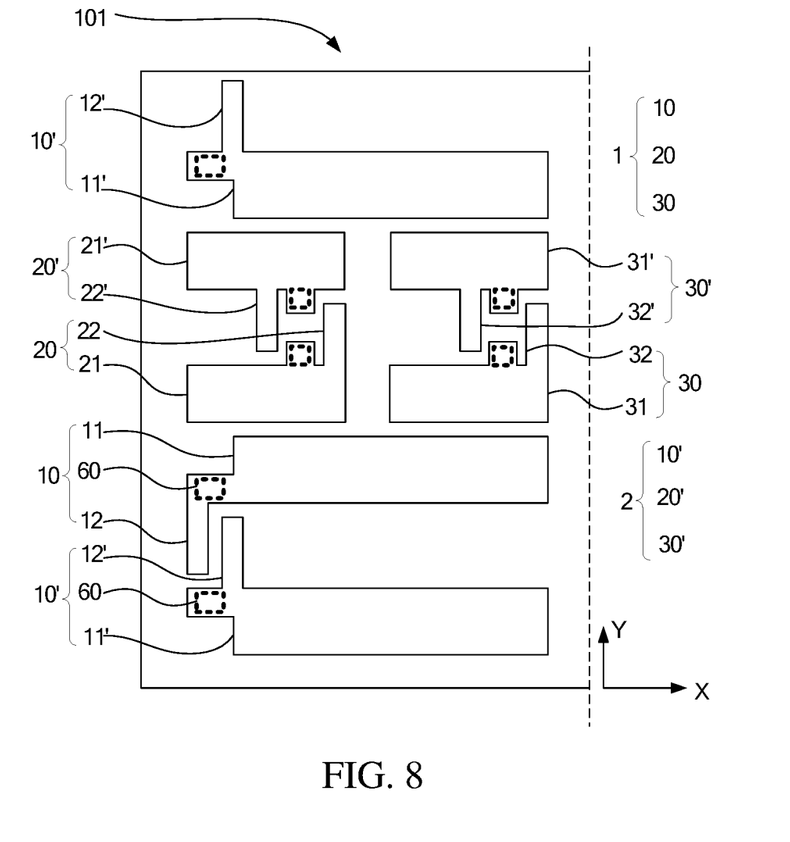
FIG. 8 is a schematic bottom view of a second OLED display panel according to an embodiment of the present application.

In an embodiment, the difference from the above embodiment is that the OLED display panel 101 shown in FIG. 8 includes a plurality of first pixel units 1 and a plurality of second pixel units 2, each the first pixel unit 1 includes a sub-pixel 10, a second sub-pixel 20, and a third sub-pixel 30. Each the second pixel unit 2 includes a first sub-pixel 10', a second sub-pixel 20', and a third sub-pixel 30'. Each sub-pixel of the first pixel unit 1 and the second pixel unit 2 further includes a bridge electrode (including 12, 22, 32, 12', 22', 32' as shown in FIG. 8). The bridge electrode and the first pixel electrodes 11 are arranged in a same layer, and the bridge electrodes are respectively connected to the corresponding pixel electrodes.

Specifically, each of the bridge electrodes is arranged close to the via-hole of a corresponding pixel electrode. The via-hole of the pixel electrode refers to the via-hole through which the pixel electrode is connected to a corresponding thin film transistor.

Furthermore, a length of the bridge electrode is less than an interval between the first pixel unit and the second pixel unit.

Specifically, materials of the first pixel electrode, the second pixel electrode, the third pixel electrode, and the bridge electrode include transparent conductive electrode materials such as indium tin oxide.

Specifically, taking the first pixel unit 1 as an example, the first sub-pixel 10 further includes a first bridge electrode 12. The first bridge electrode 12 and the first pixel electrode 11 are arranged in a same layer, that is, the first bridge electrode 12 is fabricated at the same time as the pixel electrode 11 is fabricated. Moreover, the first bridge electrode 12 is connected to a long side of the first pixel electrode 11, and the long side of the first pixel electrode 11 is arranged parallel to the longitudinal direction X of the OLED display panel 101.

Specifically, the first bridge electrode 12 is arranged close to the via-hole 60 of the first pixel electrode 11 and extends toward the adjacent first pixel electrodes 11' in different rows.

Furthermore, a length of the first bridge electrode 12 is less than an interval between the first pixel electrode 11 and the adjacent first pixel electrodes 11' in different rows. That is, the length of the first bridge electrode 12 is less than an interval between the first pixel unit 1 and the adjacent second pixel unit 2. Of course, a width of the first bridge electrode 12 is less than a length of the first pixel electrode 11.

Furthermore, the second sub-pixel 20 further includes a second bridge electrode 22, and the third sub-pixel 30 further includes a third bridge electrode 32. The second bridge electrode 22 and the third bridge electrode 32 are also arranged in a same layer as the first pixel electrode 11. Of course, the first pixel electrode 11, the second pixel electrode 21, and the third pixel electrode 31 are arranged in the same layer. The present application only uses the first pixel electrode 11 as an example to explain the position of each bridge electrode. And, the second bridge electrode 22 and the third bridge electrode 32 are connected to long sides of the second pixel electrode 21 and the third pixel electrode 31, respectively.

Furthermore, the second bridge electrode 22 is arranged close to a via-hole (not shown in the figure) of the second pixel electrode 21 and extends toward the adjacent second pixel electrodes 21' in different rows. The third bridge electrode 32 is arranged close to a via-hole of the third pixel electrode 31 and extends toward the adjacent third pixel electrodes 31' in different rows.

Furthermore, a length of the second bridge electrode 22 is less than an interval between the second pixel electrode 21 and the adjacent second pixel electrodes 21' in different rows. A length of the third bridge electrode 32 is less than an interval between the third pixel electrode 31 and the adjacent third pixel electrodes 31' in different rows. That is, the lengths of the second bridge electrode 22 and the third bridge electrode 32 are less than the interval between the first pixel unit 1 and the adjacent second pixel unit 2.

It can be understood that the three sub-pixels of the second pixel unit 2 are also provided with bridge electrodes (12', 22', and 32' shown in FIG. 8). For a specific arrangement of the bridge electrodes, reference can be made to the arrangement of the bridge electrodes of the first pixel unit 1 described above, and details are not described herein again.

Furthermore, when a sub-pixel has a short-circuit or a broken line in a manufacturing process, the bridge electrode of the sub-pixel can be bridged with the adjacent sub-pixel of a same color in different rows to repair the abnormal sub-pixel.

Specifically, taking the first sub-pixel 10 of the first pixel unit 1 as an example, when a control circuit of the first sub-pixel 10 (that is, the thin film transistor of the first sub-pixel) has a short-circuit or a broken line, the first sub-pixel 10 will be off or always on. At this time, the first bridge electrode 12 of the first sub-pixel 10 can be connected to trace under the via-hole 60 of the first pixel electrode 11' of the first sub-pixel 10' of the adjacent and different rows by laser welding or the like. So that the first sub-pixel 10 can be turned on and off simultaneously with the first sub-pixels 10' of the adjacent and different rows to avoid dark spots.

Figure 9:
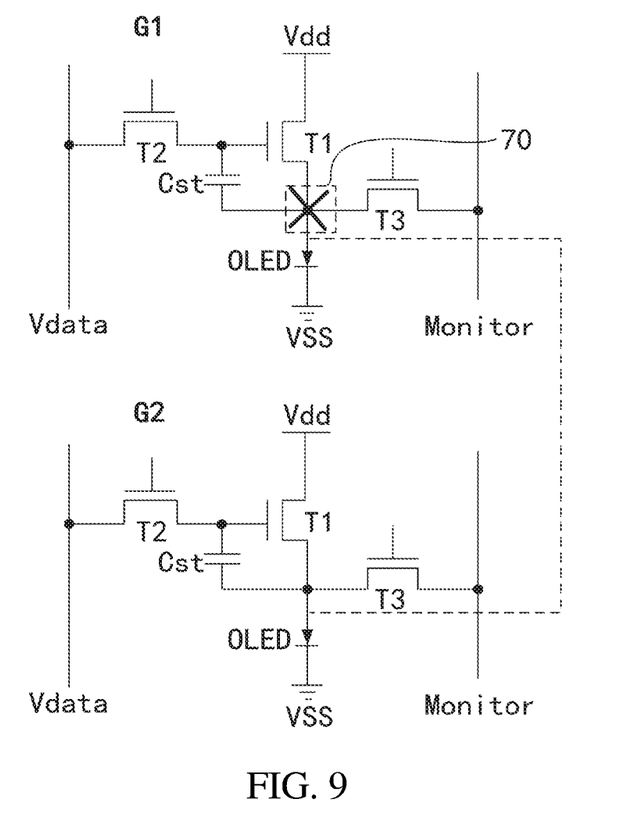
FIG. 9 is a schematic circuit diagram of a bridge electrode bridging principle according to an embodiment of the present application.

Specifically, a bridge electrode bridging principle as shown in FIG. 9, taking a conventional 3T1C (one sub-pixel including three thin-film transistors and one storage capacitor) circuit as an example, but the present application is not limited thereto. As shown in FIG. 9, when the adjacent sub-pixel G1 of same color is cut off due to a broken line or a broken circuit problem during the manufacturing process (such as a cut-off position 70 shown in FIG. 9), the sub-pixel G1 will not be lit. However, it can be connected to the adjacent sub-pixel G2 of the same color to emit light by laser welding or the like, a repair connection line as indicated by the dotted line in FIG. 9.

In the present embodiment, each sub-pixel is provided with a bridge electrode. When a short-circuit or a broken line occurs in the control circuit of a certain sub-pixel, the bridge electrode of the certain sub-pixel can be bridged with adjacent sub-pixel of the same color in different rows to repair the certain sub-pixel.

Figure 10:
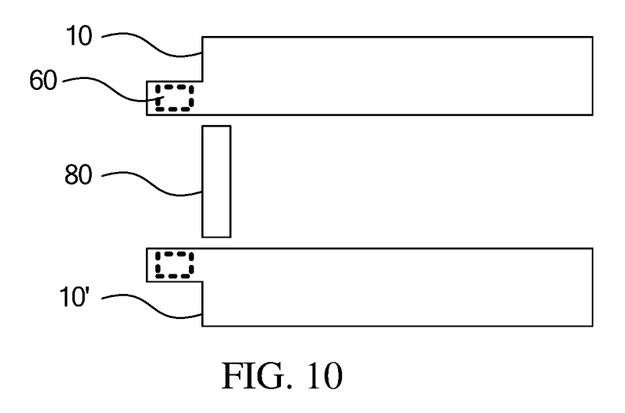
FIG. 10 is a schematic diagram of a second arrangement of the bridge electrode according to an embodiment of the present application.

In an embodiment, a difference from the above embodiment is that two adjacent sub-pixels of the same color in different rows use a same bridge electrode. Specifically, the first pixel electrodes of two first sub-pixels in adjacent and different rows are used as an example for description. As shown in FIG. 10, a bridge electrode 80 is provided between the first pixel electrode 10 and the first pixel electrodes 10' in adjacent and different rows. Both ends of the bridge electrode 80 are respectively arranged close to the two via-holes 60 of the two adjacent first pixel electrodes, but are not connected to the two adjacent first pixel electrodes. When the control circuit of any one of the two adjacent first sub-pixels has a short-circuit or a broken line, the bridge electrode 80 can be connected to traces (not shown) under the via-holes 60 of the first pixel electrodes of the two adjacent first sub-pixels by two laser welding. For other descriptions, please refer to the above-mentioned embodiments, which will not be repeated here.

Figure 11:
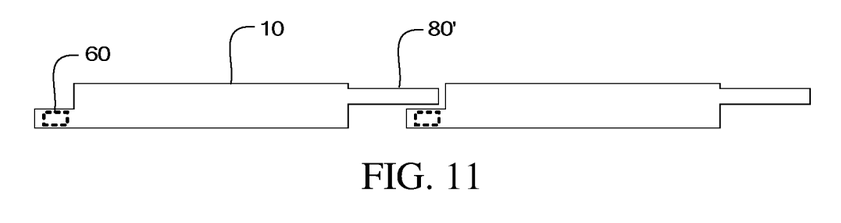
FIG. 11 is a schematic diagram of a third arrangement of the bridge electrode according to an embodiment of the present application.

In an embodiment, different from the above embodiment is that a bridge electrode 80' of each first sub-pixel can be disposed on a short side of the first pixel electrode 10 as shown in FIG. 11. When a short-circuit or a broken line occurs in the control circuit of a first sub-pixel, the bridge electrode 80' can be bridged with the trace under the via-hole 60 of the adjacent first pixel electrode 10 and in a same row. For other descriptions, please refer to the above-mentioned embodiments, which will not be repeated here.

In an embodiment, a display device is provided, which includes an OLED display panel of one of the above embodiments and a cover plate disposed on the OLED display panel, wherein the cover plate is provided with a red filter and a green filter, and the red and green filters are arranged corresponding to the second or third sub-pixel, respectively.

According to the above embodiments, it is known as follows.

The present application provides an OLED display panel and a display device. The OLED display panel includes a plurality of first pixel units and a plurality of second pixel units that are arranged symmetrically-mirrored to each other. Each pixel unit includes three sub-pixels, and a longitudinal direction of pixel electrodes of the three sub-pixels are parallel to a longitudinal direction of the OLED display panel. In cases of hybrid arrangement, it is not necessary to rotate glass substrate by 90°, and the OLED panels of two products can be printed directly. Without increasing equipment and time costs, it is suitable for mass production. In the meantime, blue sub-pixels are arranged in one row individually, and the red and green sub-pixels are arranged together in another row. In the case where an aperture ratio of the blue sub-pixels is sufficiently large, it is ensured that a printing width of the red and green sub-pixels will not be greatly reduced and the minimum printing width cannot be reached. In addition, each sub-pixel is also provided with a bridge electrode. When a broken line or a broken circuit problem occurs in a control circuit of a certain sub-pixel during manufacturing, the bridge electrode and the adjacent sub-pixel of a same color can be bridged together by laser welding, realizing a repairing function.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An organic light-emitting diode (OLED) display panel, comprising a plurality of first pixel units and a plurality of second pixel units, the first pixel units and the second pixel units arranged alternately in a short side of the OLED display panel, wherein each of the first pixel units comprises:

a first sub-pixel comprising a first pixel electrode and a first bridge electrode; wherein a long side of the first pixel electrode is arranged parallel to a long side of the OLED display panel, the first bridge electrode is connected to the long side of the first pixel electrode and extends toward a corresponding first pixel electrode of an adjacent second pixel unit; wherein the first bridge electrode is configured to connect with the corresponding first pixel electrode of the adjacent second pixel unit when the first sub-pixel short circuits;

a second sub-pixel comprising a second pixel electrode and a second bridge electrode; wherein the second pixel electrode is arranged adjacent to the first pixel electrode but in a different row, a long side of the second pixel electrode is arranged parallel to the long side of the OLED display panel, the second bridge electrode is connected to the long side of the second pixel electrode and extends toward a corresponding second pixel electrode of an adjacent second pixel unit; wherein the second bridge electrode is configured to connect with the corresponding second pixel electrode of the adjacent second pixel unit when the second sub-pixel short circuits; and a third sub-pixel comprising a third pixel electrode and a third bridge electrode; wherein the third pixel electrode and the second pixel electrode are arranged in a same row and spaced apart from each other, a long side of the third pixel electrode is arranged parallel to the long side of the OLED display, the third bridge electrode is connected to the long side of the third pixel electrode and extends toward a corresponding third pixel electrode of an adjacent second pixel unit; wherein the third bridge electrode is configured to connect with the corresponding third pixel electrode of the adjacent second pixel unit when the third sub-pixel short circuits;

wherein the first bridge electrode, the second bridge electrode, and the third bridge electrode are arranged in a same layer with the first pixel electrode, the second pixel electrode, and the third pixel electrode, respectively; and wherein the first pixel electrode is covered with an entire strip of blue electroluminescent material, and the second pixel electrode and the third pixel electrode are covered with a first electroluminescent material.

2. The OLED display panel of claim 1, wherein the first electroluminescent material comprises a yellow electroluminescent material.

3. The OLED display panel of claim 1, wherein a width of the second pixel electrode is equal to a width of the third pixel electrode, and the width of the second pixel electrode or the width of the third pixel electrode is less than or equal to a width of the first pixel electrode.

4. The OLED display panel of claim 3, wherein a sum of a length of the second pixel electrode and a length of the third pixel electrode is less than a length of the first pixel electrode.

5. The OLED display panel of claim 4, wherein the length of the second pixel electrode is equal to the length of the third pixel electrode.

6. The OLED display panel of claim 1, wherein each of the first pixel electrode, the second pixel electrode, and the third pixel electrode has a via-hole.

7. The OLED display panel of claim 6, wherein each of the first bridge electrode, the second bridge electrode, and the third bridge electrode is arranged close to the via-hole.

8. The OLED display panel of claim 7, wherein a length of each of the first bridge electrode, the second bridge electrode, and the third bridge electrode is less than an interval between the first pixel unit and the second pixel unit.

9. The OLED display panel of claim 1, wherein materials of the first pixel electrode, the second pixel electrode, the third pixel electrode, the first bridge electrode, the second bridge electrode, and the third bridge electrode comprise indium tin oxide.

10. A display device, comprising an organic light-emitting diode (OLED) display panel and a cover plate provided on the OLED display panel, the OLED display panel comprising a plurality of first pixel units and a plurality of second pixel units, the first pixel units and the second pixel units arranged alternately in a short side of the OLED display panel, wherein each of the first pixel units comprises:
- a first sub-pixel comprising a first pixel electrode and a first bridge electrode; wherein a long side of the first pixel electrode is arranged parallel to a long side of the OLED display panel, the first bridge electrode is connected to the long side of the first pixel electrode and extends toward a corresponding first pixel electrode of an adjacent second pixel unit; wherein the first bridge electrode is configured to connect with the corresponding first pixel electrode of the adjacent second pixel unit when the first sub-pixel short circuits;
- a second sub-pixel comprising a second pixel electrode and a second bridge electrode; wherein the second pixel electrode is arranged adjacent to the first pixel electrode but in a different row, a long side of the second pixel electrode is arranged parallel to the long side of the OLED display panel, the second bridge electrode is connected to the long side of the second pixel electrode and extends toward a corresponding second pixel electrode of an adjacent second pixel unit; wherein the second bridge electrode is configured to connect with the corresponding second pixel electrode of the adjacent second pixel unit when the second sub-pixel short circuits; and
- a third sub-pixel comprising a third pixel electrode and a third bridge electrode; wherein the third pixel electrode and the second pixel electrode are arranged in a same row and spaced apart from each other, a long side of the third pixel electrode is arranged parallel to the long side of the OLED display, the third bridge electrode is connected to the long side of the third pixel electrode and extends toward a corresponding third pixel electrode of an adjacent second pixel unit; wherein the third bridge electrode is configured to connect with the corresponding third pixel electrode of the adjacent second pixel unit when the third sub-pixel short circuits;
- wherein the first bridge electrode, the second bridge electrode, and the third bridge electrode are arranged in a same layer with the first pixel electrode, the second pixel electrode, and the third pixel electrode, respectively;
- wherein the first pixel electrode is covered with an entire strip of blue electroluminescent material, and the second pixel electrode and the third pixel electrode are covered with a first electroluminescent material; and
- wherein the cover plate is provided with a red filter and a green filter, and the red filter and the green filter are arranged corresponding to the second sub-pixel or the third sub-pixel, respectively.

11. The display device of claim 10, wherein the first electroluminescent material comprises a yellow electroluminescent material.

12. The display device of claim 10, wherein a width of the second pixel electrode is equal to a width of the third pixel electrode, and the width of the second pixel electrode or the width of the third pixel electrode is less than or equal to a width of the first pixel electrode.

13. The display device of claim 12, wherein a sum of a length of the second pixel electrode and a length of the third pixel electrode is less than a length of the first pixel electrode.

14. The display device of claim 13, wherein the length of the second pixel electrode is equal to the length of the third pixel electrode.

15. The display device of claim 10, wherein each of the first pixel electrode, the second pixel electrode, and the third pixel electrode has a via-hole.

16. The display device of claim 15, wherein each of the first bridge electrode, the second bridge electrode, and the third bridge electrode is arranged close to the via-hole.

17. The display device of claim 16, wherein a length of each of the first bridge electrode, the second bridge electrode, and the third bridge electrode is less than an interval between the first pixel unit and the second pixel unit.

18. The display device of claim 10, wherein materials of the first pixel electrode, the second pixel electrode, the third pixel electrode, the first bridge electrode, the second bridge electrode, and the third bridge electrode comprise indium tin oxide.

* * * * *